United States Patent
Lim et al.

(10) Patent No.: US 9,450,153 B2
(45) Date of Patent: Sep. 20, 2016

(54) LIGHT EMITTING DIODE AND METHOD OF MANUFACTURING THE SAME

(71) Applicant: Seoul Viosys Co., Ltd., Ansan-si (KR)

(72) Inventors: Hyoung Jin Lim, Ansan-si (KR); Chan Seob Shin, Ansan-si (KR); Kyu Ho Lee, Ansan-si (KR); Tae Gyun Kim, Ansan-si (KR); Sung Won Tae, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/949,554

(22) Filed: Nov. 23, 2015

(65) Prior Publication Data

US 2016/0087158 A1 Mar. 24, 2016

Related U.S. Application Data

(63) Continuation-in-part of application No. PCT/KR2015/003959, filed on Apr. 21, 2015.

(30) Foreign Application Priority Data

Apr. 22, 2014 (KR) .................. 10-2014-0048180

(51) Int. Cl.
*H01L 33/42* (2010.01)
*H01L 33/22* (2010.01)

(52) U.S. Cl.
CPC .............. *H01L 33/42* (2013.01); *H01L 33/22* (2013.01); *H01L 2933/0016* (2013.01); *H01L 2933/0091* (2013.01)

(58) Field of Classification Search
CPC .................. H01L 33/42; H01L 33/22; H01L 2933/0091; H01L 2933/0016
See application file for complete search history.

(56) References Cited

U.S. PATENT DOCUMENTS

| 2004/0157358 A1* | 8/2004 | Hiramatsu | C30B 25/02 438/93 |
|---|---|---|---|
| 2011/0097832 A1 | 4/2011 | Fan | |
| 2013/0153950 A1 | 6/2013 | Mizutani | |

FOREIGN PATENT DOCUMENTS

| JP | 2009-094107 A | 4/2009 |
|---|---|---|
| KR | 10-2007-0097642 A | 10/2007 |
| KR | 10-2011-0130204 A | 12/2011 |

OTHER PUBLICATIONS

Park, H. L., Authorized Officer, Korean Intellectual Property Office, International Application No. PCT/KR2013/007091, Jun. 30, 2015, 6 pages.

* cited by examiner

*Primary Examiner* — Michelle Mandala
(74) *Attorney, Agent, or Firm* — Perkins Coie LLP

(57) ABSTRACT

Disclosed herein are a light emitting diode including a plurality of protrusions including zinc oxide and a method for manufacturing the same. According to an exemplary embodiment of the present disclosure, the light emitting diode includes: a substrate; a nitride light emitting structure disposed on the substrate; and a transparent electrode layer disposed on the nitride light emitting structure, wherein the transparent electrode layer includes a plurality of protrusions, the plurality of protrusions each have a lower portion and an upper portion, and a side of the lower portion and a side of the upper portion have different gradients.

12 Claims, 3 Drawing Sheets

LIGHT EMITTING DIODE AND METHOD OF MANUFACTURING THE SAME

PRIORITY CLAIMS AND CROSS-REFERENCE TO RELATED APPLICATION

This patent document is a continuation-in-part of, and claims priority and the benefits of, a Patent Cooperation Treaty (PCT) application number PCT/KR2015/003959, entitled "LIGHT EMITTING DIODE AND MANUFACTURING METHOD THEREFOR" and filed with the Korean Intellectual Property Office (KIPO) on Apr. 21, 2015, which further claims priority and benefits of Korean Application No. 10-2014-0048180, entitled "LIGHT EMITTING DIODE AND MANUFACTURING METHOD THEREFOR" and filed with the Korean Intellectual Property Office (KIPO) on Apr. 22, 2014, the contents of which are incorporated by reference in their entirety.

TECHNICAL FIELD

The present disclosure relates to a light emitting diode and a method for manufacturing the same, which has a plurality of protrusions including zinc oxide.

BACKGROUND

A light emitting diode converts electric energy into light energy. The light emitting diode can implement various colors by controlling a composition ratio of compound semiconductor.

The light emitting diode emits energy corresponding to an energy gap between a conduction band and a valance band by a combination of electrons of an n layer and holes of a p layer when a forward voltage is applied to the light emitting diode. The energy is mainly emitted in a heat or light form. In the case of the light emitting diode, the energy is emitted in the light form.

For example, nitride semiconductor has high thermal stability and wide band gap energy. As a result, the nitride semiconductor has received much attention in development fields of optical devices and high output electronic devices. In particular, a blue light emitting diode, a green light emitting diode, an ultraviolet (UV) light emitting diode, and the like using the nitride semiconductor have been widely commercialized.

The existing nitride semiconductor has a problem of non-uniformity of current injection, low heat emission efficiency, low light emission efficiency, etc. Therefore, to use the light emitting diode including the nitride semiconductor as a high efficiency light source, the technical development for maximum internal quantum efficiency, high transparent ohmic electrode, and improvement in light extraction is very important. Recently, many studies have been conducted on improvement in external quantum efficiency by improving the light extraction efficiency rather than on improvement in the external quantum efficiency by improving the internal quantum efficiency.

SUMMARY

Some implementations of the disclosed technology provide a light emitting diode and a method for manufacturing the same capable of improving light extraction efficiency.

Some implementations of the disclosed technology provide a light emitting diode and a method for manufacturing the same capable of preventing a surface of the light emitting diode from being damaged at the time of forming a plurality of protrusions.

Some implementations of the disclosed technology provide a light emitting diode and a method for manufacturing the same capable of effectively controlling a formation of a plurality of protrusions.

Some implementations of the disclosed technology provide a light emitting diode and a method for manufacturing the same capable of effectively forming a plurality of protrusions by a simple process.

According to an exemplary embodiment of the present disclosure, a light emitting diode is provided to include: a substrate; a nitride light emitting structure disposed over the substrate; and a transparent electrode layer disposed over the nitride light emitting structure, wherein the transparent electrode layer includes a plurality of protrusions, the plurality of protrusions each have a lower portion and an upper portion, and a side of the lower portion and a side of the upper portion have different gradients.

In some implementations, the transparent electrode layer can include zinc oxide.

In some implementations, the side of the lower portion included the plurality of protrusions can be a substantially vertical surface.

In some implementations, the side of the upper portion included the plurality of protrusions can have a gradient of 20 to 80° with respect to the substantially vertical surface.

In some implementations, the side of the upper portion included the plurality of protrusions can have a gradient continuously decreasing or increasing with respect to the substantially vertical surface.

In some implementations, a horizontal width of the upper portion included the plurality of protrusions can be smaller than that of the lower portion.

In some implementations, the plurality of protrusions each can generally be a disc shape or a hexagonal prism shape.

In some implementations, the nitride light emitting structure can include a first conductive type nitride semiconductor layer, an active layer, and a second conductive type nitride semiconductor layer.

According to another exemplary embodiment of the present disclosure, a method of manufacturing a light emitting diode is provided. The method may comprise forming a seed layer on a nitride light emitting structure; forming a mask pattern on the seed layer; forming a plurality of protrusions by re-growing the seed layer, wherein the plurality of protrusions each have a lower portion and an upper portion, and a side of the lower portion and a side of the upper portion have different gradients.

In some implementations, the seed layer and the plurality of protrusions can form a transparent electrode.

In some implementations, the transparent electrode can include zinc oxide.

In some implementations, the side of the lower portion can be a substantially vertical surface.

In some implementations, the side of the upper portion can have a gradient of 20 to 80° with respect to the substantially vertical side.

In some implementations, the upper portion has a horizontal width smaller than that of the lower portion.

In some implementations, the lower portion has a height same as a thickness of the mask pattern.

In some implementations, the forming of the plurality of protrusions by re-growing the seed layer can include performing re-growing by a hydrothermal synthesis method.

In some implementations, the hydrothermal synthesis method can use a mixed solution of zinc salt and hexamethylenetetramine.

In some implementations, the mask pattern can be formed using a lift-off technology.

In some implementations, the mask pattern can include oxides, nitrides, organic matters, or polymer.

In some implementations, the lift-off process can include forming a mask layer on a photoresist pattern and removing the photoresist pattern and the mask layer can be formed using a thermal deposition method, an electron beam deposition method, or a sputter deposition method.

DETAILED DESCRIPTION

Figure 1:
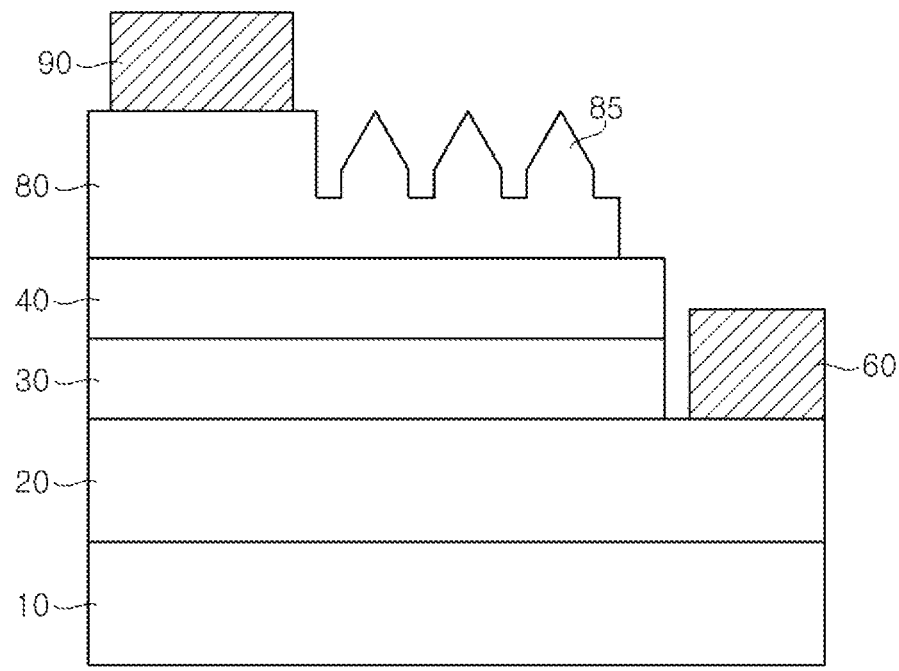
FIG. 1 is a cross-sectional view illustrating an exemplary light emitting diode according to an exemplary embodiment of the present disclosure.

Many research developments have been conducted to improve the light extraction efficiency. Examples of the developments include changing a surface structure of the light emitting diode such as a surface roughness technology, a photonoic crystal structure technology, etc. The surface roughness technology includes a process of forming a roughness pattern including a plurality of protrusions on the surface of the light emitting diode using dry etching, wet etching, or the like.

As an example, Korean Patent No. 10-0568830 discloses a III-nitride semiconductor light emitting device capable of increasing external quantum efficiency of a light emitting device by forming protrusions having roughness on an exposed surface. According to the related art, a plurality of protrusions are formed on the exposed surface of the III-nitride semiconductor light emitting device by using a dry etching method including an ICP method, etc. However, due to the process of forming the plurality of protrusions by the dry etching method, the surface of the light emitting diode can be damaged due to ion bombardment. Further, the process for forming the plurality of protrusions by the wet etching method is hard to control an etched degree when the surface of the light emitting diode is formed of materials having properties very vulnerable to an acid.

Hereinafter, exemplary embodiments of the present disclosure will be described in detail with reference to the accompanying drawings. It is to be noted that in giving reference numerals to components of each of the accompanying drawing, like reference numerals refer to like elements even though the like components are shown in different drawings. Further, in describing exemplary embodiments of the present disclosure, well-known functions or constructions will not be described in detail when it is determined that they can unnecessarily obscure the gist of the present disclosure. In addition, although exemplary embodiments of the present disclosure will be described below, the scope of the present disclosure is not limited thereto, but can be variously modified by those skilled in the art.

FIG. 1 is a cross-sectional view illustrating an exemplary light emitting diode according to an exemplary embodiment of the present disclosure.

Referring to FIG. 1, a light emitting diode includes a substrate 10, a first conductive type nitride semiconductor layer 20, an active layer 30, a second conductive type nitride semiconductor layer 40, a first electrode 60, a transparent electrode layer 80, and a second electrode 90. The transparent electrode layer 80 includes protrusions 85.

The first conductive type nitride semiconductor layer 20, the active layer 30, and the second conductive type nitride semiconductor layer 40 can be sequentially disposed on the substrate 10. The first conductive type nitride semiconductor layer 20, the active layer 30, and the second conductive type nitride semiconductor layer 40 can form a nitride light emitting structure. The first conductive type nitride semiconductor layer 20, the active layer 30, and the second conductive type nitride semiconductor layer 40 can be each made of or include gallium nitride-based compound semiconductor materials, that is, (Al, In, Ga)N. In particular, the active layer 30 has a composition element and a composition ratio to emit light having a required wavelength, for example, ultraviolet rays or blue light and the first conductive type nitride semiconductor layer 20 and the second conductive type nitride semiconductor layer 40 can have a band gap greater than that of the active layer 30.

Further, the first conductive type nitride semiconductor layer 20, the active layer 30, and the second conductive type nitride semiconductor layer 40 can be controllably or continuously grown using metal organic chemical vapor deposition (MOCVD), molecular beam epitaxy, hydride vapor phase epitaxy (HVPE) technologies, or the like. A thickness of a nitride light emitting structure including the grown semiconductor layers 20, 30, and 40 can range from 5 to 10 µm.

Here, the first conductive type nitride semiconductor layer 20 and the second conductive type nitride semiconductor layer 40 are an N type and a P type, respectively or vice versa. In the gallium nitride-based compound semiconductor layer, an N type semiconductor layer can be formed by doping impurities, for example, silicon (Si) and a P type semiconductor layer can be formed by doping impurities, for example, magnesium (Mg).

The first conductive type nitride semiconductor layer 20 and/or a second conductive type nitride semiconductor layer 40 can have a single layer structure as described above, or a multi-layer structure. Further, the active layer 30 can have a single quantum well structure or a multi-layer quantum well structure.

Further, a buffer layer (not illustrated) can be interposed between the semiconductor layers 20, 30, and 40 and the substrate 10, prior to forming the first conductive type nitride semiconductor layer 20. The buffer layer can be formed to relieve a lattice mismatch between the substrate 10 and the first conductive type nitride semiconductor layer 20 which will be formed thereon.

A transparent electrode layer 80 can be formed on the second conductive type nitride semiconductor layer 40. The transparent electrode layer 80 includes a plurality of protrusions 85. The transparent electrode layer 80 and the plurality of protrusions 85 formed in the transparent electrode layers 80 can include zinc oxide. The plurality of protrusions 85 included in the transparent electrode layer 80 can be re-grown by a hydrothermal synthesis method which will be described below.

Each of the plurality of protrusions 85 can include a lower portion and an upper portion. A side of the lower portion and a side of the upper portion which are included in the protrusion 85 can have different gradients. The side of the lower portion included in the protrusion 85 can be a substantially vertical. In this case, the side of the lower portion included in the protrusion 85 has no gradient with respect to a substantially vertical surface.[NN1] The substantially vertical surface can mean a surface substantially vertical to a lower surface of the transparent electrode layer 80 or an upper surface of the second conductive type nitride semiconductor layer 40. Further, the side of the upper portion included in the protrusion 85 can have a gradient of a range of 20 to 80° with respect to the substantially vertical surface. A horizontal width of the lower portion included in the protrusion 85 can be smaller than that of the upper portion. That is, when the side of the upper portion has a gradient and the side of the lower portion is a substantially vertical surface, the horizontal width of the upper portion included in the protrusion 85 can be smaller than that of the lower portion. When viewing the protrusion 85 from the top, the protrusion 85 can be or include a circular shape or a polygonal shape. Further, the protrusion 85 can generally have a disc shape or a polygonal prism shape including a hexagonal prism shape. However, a shape of the protrusion 85 is not limited thereto and other implementations are also possible.

According to the exemplary embodiment of the present disclosure, when viewing the protrusion 85 from the side, the lower portion is viewed as a rectangular shape and the upper portion is viewed as a triangular shape, but the shapes of the lower portion and the upper portion included in the protrusion 85 are not limited thereto and other implementations are also possible. Therefore, the upper portion of the protrusion 85 can be or include a trapezoidal shape including a flat upper surface.

Further, the side of the upper portion included in the protrusion 85 can have a gradient continuously increasing or decreasing with respect to the substantially vertical surface. That is, although not illustrated, when the overall shape of the upper portion included in the protrusion 85 has a semi-spherical shape, the side of the upper portion can have the gradient continuously increasing with respect to the substantially vertical surface until the side of the upper portion reaches the top upper end area of the upper portion. However, the shape of the protrusion 85 is not limited thereto but can include the case in which at least a portion of the side of the upper portion included in the protrusion 85 is a curved surface with respect to the substantially vertical surface.

The plurality of protrusions 85 can form a predetermined pattern. The plurality of protrusions 85 can have the same crystal structure as the transparent electrode layer 80.

The light emitting diode according to the exemplary embodiment of the present disclosure scatters light emitted from the active layer 30 through the plurality of protrusions 85 included in the transparent electrode layer 80, thereby improving the light extraction efficiency.

The first electrode 60 can be formed on one area of the first conductive type nitride semiconductor layer 20. The second electrode 90 can be disposed on one area of the transparent electrode layer 80. The first electrode 60 and the second electrode 90 are for supplying a current and wire bonding to the outside and can be made of or include Ti, Al, Cr, Ni, Au, Ag, Rd, or Ru or a combination of at least two thereof.

Figure 2:
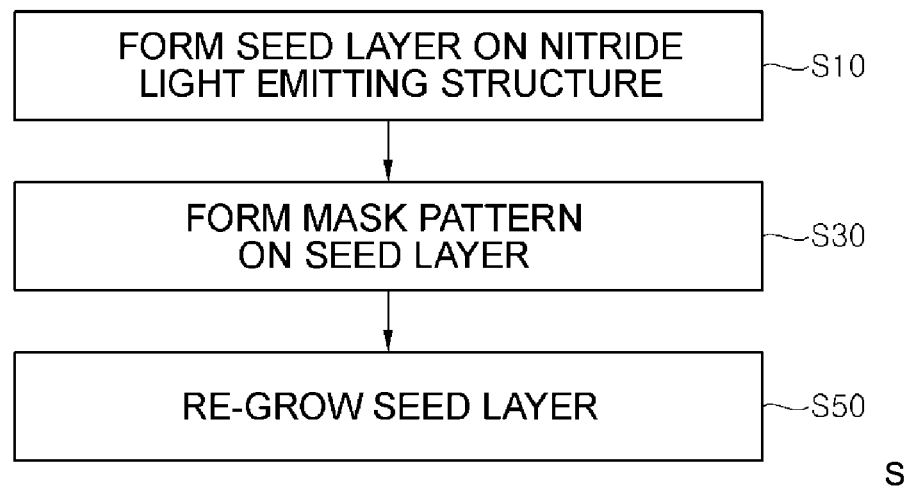
FIG. 2 is a flow chart illustrating a method for manufacturing an exemplary light emitting diode according to an exemplary embodiment of the present disclosure.
Figure 3:
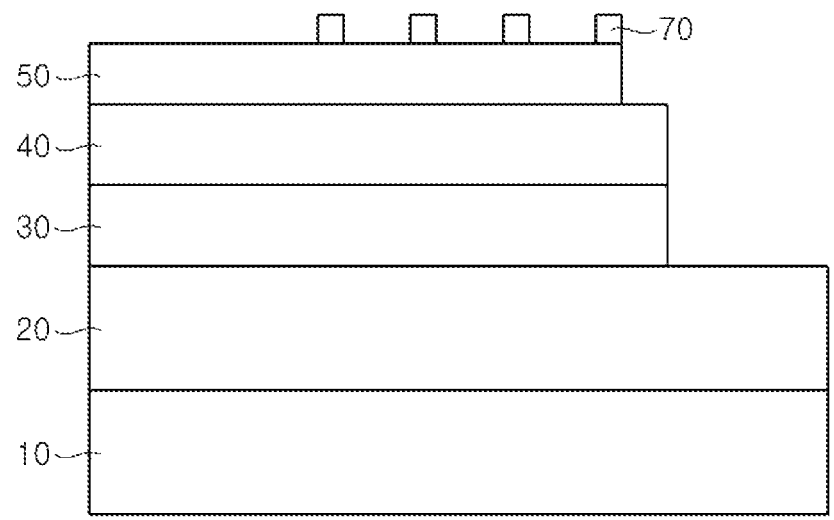
FIGS. 3 to 5 are cross-sectional views illustrating an exemplary light emitting diode according to a method for manufacturing a light emitting diode according to an exemplary embodiment of the present disclosure.
Figure 4:
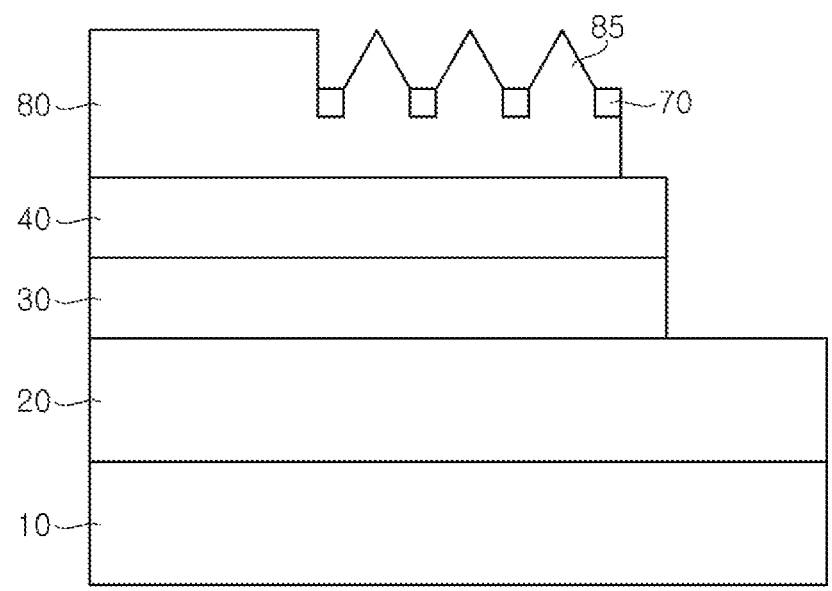
Figure 5:
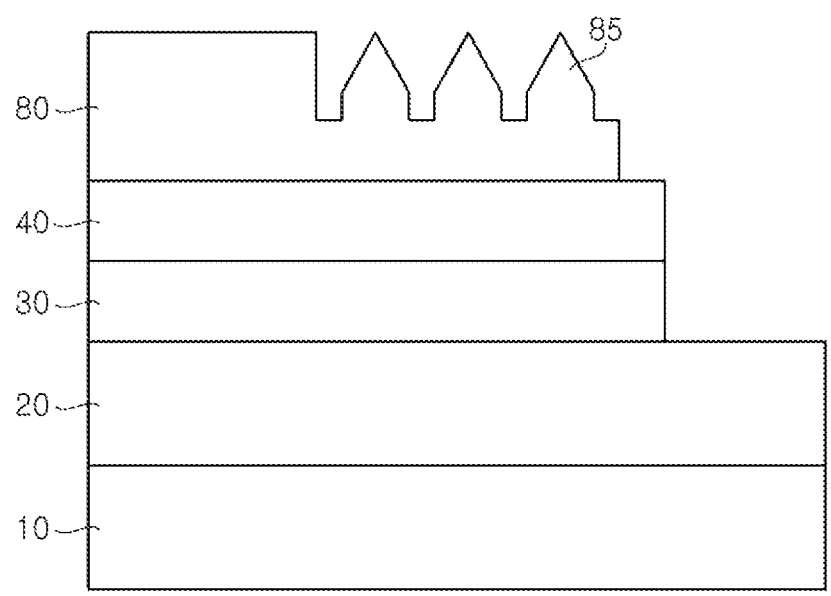

FIG. 2 is a flow chart illustrating a method for manufacturing an exemplary light emitting diode according to an exemplary embodiment of the present disclosure. FIGS. 3 to 5 are cross-sectional views illustrating an exemplary light emitting diode according to a method for manufacturing a light emitting diode.

Referring to FIG. 2, the method for manufacturing a light emitting diode includes forming a seed layer on a nitride light emitting structure (S10), forming a mask pattern on the seed layer (S30), and re-growing the seed layer (S50).

In the forming of the seed layer on the nitride light emitting structure (S10), first, the first conductive type nitride semiconductor layer 20, the active layer 30, and the second conductive type nitride semiconductor layer 40 are formed on the substrate. The nitride light emitting structure can include the first conductive type nitride semiconductor layer 20, the active layer 30, and the second conductive type nitride semiconductor layer 40. The seed layer 50 can be formed on the second conductive type nitride semiconductor layer 40. The seed layer 50 can include zinc oxide (ZnO). The seed layer 50 can be formed by a deposition process or a coating process. In detail, a zinc oxide powder can be evaporated to be deposited on the second conductive type nitride semiconductor layer 40 or can be directly coated on the second conductive type nitride semiconductor layer 40 to form the seed layer 50. Further, the seed layer 50 can be formed by a thermal deposition method, a pulsed laser deposition method, a thermal decomposition method, a spin coating method, a hydrothermal synthesis method, an organic metal deposition method, or a vacuum deposition method using an electronic beam.

In the forming of the mask pattern on the seed layer (S30), referring to FIG. 3, the mask pattern 70 can be formed on the seed layer 50. The mask pattern 70 can be formed by using a lift off technology. In some implementations, the mask pattern 70 can be formed by a photolithography process and a deposition process. For example, a mask layer is formed on a photoresist pattern on the seed layer 50 and the mask pattern 70 can be formed by removing the photoresist pattern.

A portion of the seed layer 50 can be exposed between the respective masking elements of the mask pattern 70. Each masking element included in the mask pattern 70 can have various shapes, in consideration of a shape and a size of the zinc oxide structure which will be re-grown on the seed layer 50 of which a portion is exposed. Therefore, the area in which the seed layer 50 of the mask pattern 70 is exposed can have an island pattern, etc.

In forming the mask pattern 70, the deposition process can performed by using spin coating, a thermal deposition method, an electron beam evaporation method, a sputter deposition method, or the like. The mask pattern 70 can be formed of or include oxides, nitrides, organic matters, or polymer. The mask pattern 70 can be formed of or include $Al_2O_3$, MgO, NiO, ITO, or $SiO_2$.

In the re-growing of the seed layer (S50), referring to FIG. 4, the plurality of protrusions 85 can be formed by re-growing the seed layer 50 of which the surface is not formed with the mask pattern 70. The plurality of protrusions 85 can be grown by the hydrothermal synthesis method. That is, when the seed layer 50 having the mask pattern 70 formed on the surface thereof is dipped in an aqueous solution including Zn and O ions, the Zn and O ions can be adsorbed to the exposed seed layer 50 to perform nucleation and growth. That is, the seed layer 50 of which the surface is not formed with the mask pattern 70 can serve as a seed growing the plurality of protrusions 85. The plurality of grown protrusions 85 can be grown along the crystal structure of the seed layer 50.

A shape, a diameter, and a length of the plurality of protrusions 85 can be controlled by changing conditions of temperature, time, an amount of aqueous solution, a mole ratio, pH, etc., during the performance of the hydrothermal synthesis. Therefore, the protrusions 85 having various diameters, shapes, heights, etc., can be formed according to purpose. Further, the plurality of formed protrusions 85 can form a predetermined pattern. Further, the hydrothermal synthesis aqueous solution includes deionized water, zinc salt, and hexamethylenetetramine, in which a mole ratio of the zinc salt and the hexamethylenetetramine can be kept at 2:1 to 1:2. The hexamethylenetetramine serves as a catalyst to help a fast formation of the protrusions and can continuously supply OH— ion, etc. In addition to the hexamethylenetetramine, urea, ammonia, etc., can be used.

Further, among the hydrothermal synthesis aqueous solutions, a mole concentration of the aqueous solution of the zinc salt and the hexamethylenetetramine can range from 0.0001M to 1M. When the mole concentration is below 0.0001 M, it is difficult to control a content of the zinc salt and the protrusions 85 are not formed well and when the mole concentration exceeds 1 M, source consumption amount for growing the protrusions 85 is increased and thus it is difficult to control a shape and a size of the protrusions 85. The zinc salt can be zinc nitrate hexahydrate.

Referring to FIG. 5, after the plurality of protrusions 85 are sufficiently grown between the mask patterns 70, the mask pattern 70 can be removed. The protrusions 85 according to the exemplary embodiment of the present disclosure can be grown on the seed layer 50 exposed between the mask patterns 70. The grown protrusions 85 and the seed layer 50 form the transparent electrode layer. Therefore, according to the light emitting diode and the method for manufacturing the same according to the exemplary embodiment of the present disclosure, the protrusion 85 pattern can be effectively formed on the surface of the light emitting diode by the simple process without using the dry or wet etching process. Therefore, the damage of the surface of the light emitting diode can be prevented and the growth and the shape of the protrusions 85 formed on the surface can be easily controlled. Further, the grown protrusions 85 are combined with the seed layer 50 to form the transparent electrode layer 85, and therefore the process is more simplified and economical than the process of separately forming the transparent electrode layer and then forming a fine pattern thereon.

The side of the lower portion and the side of the upper portion which are included in each of the plurality of protrusions 85 and have different gradients can be exposed by removing the mask pattern 70. That is, the lower portion of the protrusions 85 adjacently grown to the mask pattern 70 has the side which is the substantially vertical surface and the upper portion of the protrusion 85 grown beyond the thickness of the mask pattern 70 has an inclined side. That is, the height of the lower portion of the protrusion 85 can depend on the thickness of the mask pattern 70.

The side of the upper portion of the protrusion 85 can have a gradient inclined inwardly. In this case, a horizontal width of the lower portion of the protrusion 85 can be greater than that of the upper portion.

Referring back to FIG. 1, after the mask pattern 70 is removed, the first electrode 60 can be formed on one area of the first nitride semiconductor layer 20 and the second electrode 90 can be formed on one area of the transparent electrode layer 80 on which the plurality of protrusions 85 are not formed.

The transparent electrode layer included in the light emitting diode according to the exemplary embodiment of the present disclosure includes the plurality of protrusions. Therefore, the scattering occurs in the transparent electrode layer to improve the external extraction efficiency of light generated from the active layer.

According to the exemplary embodiment of the present disclosure, the light emitting diode and the method for manufacturing the same can improve the light extraction efficiency of the light emitting diode by forming the plurality of protrusions on the surface of the light emitting diode.

According to the exemplary embodiment of the present disclosure, the plurality of protrusions are formed without using the dry etching method or the wet etching method. Therefore, it is possible to prevent the surface of the light emitting diode from being damaged and effectively control the formation of the plurality of protrusions even when the surface of the light emitting diode includes the materials having properties vulnerable to the acid.

Further, according to the exemplary embodiment of the present disclosure, the light emitting diode and the method for manufacturing the same can form the pattern including the plurality of protrusions on the surface of the light emitting diode by the simple process, which is economical.

Various implementations of the present disclosure has been described only by way of example hereinabove, and the present disclosure can be variously modified, altered, or substituted by those skilled in the art to which the present disclosure pertains without departing from essential features of the present disclosure. Accordingly, the exemplary embodiments disclosed in the present disclosure and the accompanying drawings do not limit the disclosed technology, and the scope of the present disclosure is not limited by the exemplary embodiments and the accompanying drawings. The scope of the present disclosure should be interpreted by the following claims, and it should be interpreted that all the spirits equivalent to the following claims fall within the scope of the present disclosure.

What is claimed is:

1. A method of manufacturing a light emitting diode, comprising:
    forming a seed layer on a nitride light emitting structure;
    forming a mask pattern on the seed layer;
    forming a plurality of protrusions by re-growing the seed layer,
    wherein the plurality of protrusions each have a lower portion and an upper portion, and
    a side of the lower portion and a side of the upper portion have different gradients.

2. The method of claim 1, wherein the seed layer and the plurality of protrusions form a transparent electrode.

3. The method of claim 2, wherein the transparent electrode includes zinc oxide.

4. The method of claim 1, wherein the side of the lower portion is a substantially vertical.

5. The method of claim 4, wherein the side of the upper portion has a gradient of 20 to 80° with respect to the substantially vertical side.

6. The method of claim 1, wherein the upper portion has a horizontal width smaller than that of the lower portion.

7. The method of claim 1, wherein the lower portion has a height same as a thickness of the mask pattern.

8. The method of claim 1, wherein the forming of the plurality of protrusions by re-growing the seed layer includes performing re-growing by a hydrothermal synthesis method.

9. The method of claim 8, wherein the hydrothermal synthesis method uses a mixed solution of zinc salt and hexamethylenetetramine.

10. The method of claim 1, wherein the mask pattern is formed using a lift-off technology.

11. The method of claim 10, wherein the mask pattern includes oxides, nitrides, organic matters, or polymer.

12. The method of claim 10, wherein the lift-off process includes forming a mask layer on a photoresist pattern and removing the photoresist pattern, and the mask layer is formed using a thermal deposition method, an electron beam deposition method, or a sputter deposition method.

* * * * *